(12) United States Patent
Betancourt et al.

(10) Patent No.: US 6,514,355 B1
(45) Date of Patent: Feb. 4, 2003

(54) METHOD AND APPARATUS FOR RECOVERY OF SEMICONDUCTOR WAFERS FROM A CHEMICAL TANK

(75) Inventors: Ernest Betancourt, Essex Junction, VT (US); Jeffrey A. Brigante, Colchester, VT (US); Glenn W. Gale, Austin, TX (US); William Salamon, Jr., Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/246,430

(22) Filed: Feb. 8, 1999

(51) Int. Cl.[7] ................................................. B08B 7/04
(52) U.S. Cl. .............................. 134/18; 134/10; 134/2; 134/3; 134/26; 134/34; 134/113; 134/902
(58) Field of Search ............................ 134/2, 3, 1, 1.3, 134/10, 18, 26, 27, 34, 902, 111, 113, 115 R, 28, 29, 30

(56) References Cited

U.S. PATENT DOCUMENTS

| | | | |
|---|---|---|---|
| 4,784,169 A | | 11/1988 | Striedieck |
| 4,997,490 A | * | 3/1991 | Vetter et al. ................... 134/26 |
| 5,000,208 A | * | 3/1991 | Ludvig et al. .......... 134/902 X |
| 5,069,235 A | | 12/1991 | Vetter et al. |
| 5,091,103 A | * | 2/1992 | Dean et al. |
| 5,148,823 A | | 9/1992 | Bran |
| 5,540,245 A | | 7/1996 | Munakata et al. |
| 5,656,097 A | | 8/1997 | Olesen et al. |
| 5,937,878 A | * | 8/1999 | Cheng ......................... 134/111 |
| 5,950,645 A | * | 9/1999 | Olesen et al. ............... 134/98.1 |
| 6,021,791 A | * | 2/2000 | Dryer et al. ............. 134/100.1 |

OTHER PUBLICATIONS

Handbook of Semiconductor Wafer Cleaning Technology, Noyes Publications, pp. 15–22, 1993.*

* cited by examiner

Primary Examiner—Alexander Markoff
(74) Attorney, Agent, or Firm—Schmeiser, Olsen & Watts

(57) ABSTRACT

A method for stopping chemical processing of a semiconductor wafer in an emergency included the steps of: 1) placing a chemical having a water concentration of about 92% or less in a tank; 2) processing a semiconductor wafer with the chemical in the process tank; 3) detecting a malfunction in the processing; 4) quick draining the chemical from the process tank; and 5) rinsing the wafer in the process tank with a rinsing material to stop chemical action. Optionally, the method may include recycling the drained chemical from a storage tank to the process tank for use in a subsequent process step. Also, a chemical processing system includes: 1) a process tank adapted to processing semiconductor wafers in a chemical having a water concentration of about 92% or less; 2) a control system adapted to detecting a malfunction in processing; 3) a drain valve adapted to quick draining the chemical in the process tank; 4) a storage tank adapted to storing the quick drained chemical; 5) a spray bar adapted to applying a rinsing material to the wafers in the process tank; and 6) a recycling mechanism adapted to returning the quick drained chemical to the process tank.

34 Claims, 6 Drawing Sheets

METHOD AND APPARATUS FOR RECOVERY OF SEMICONDUCTOR WAFERS FROM A CHEMICAL TANK

BACKGROUND OF THE INVENTION

1. Technical Field

This invention relates to the field of semiconductor processing. More specifically, the invention relates to recovering semiconductor wafers from a chemical tank.

2. Background Art

In the processing of industrial parts such as semiconductor wafers, automated chemical processing systems are frequently used. In such systems, batches of parts such as semiconductor wafers are immersed in various chemical baths by a robotic handler for very precise, programmed durations. In the event that a malfunction of the robot or associated computer hardware or software occurs, the parts being processed may become "stranded" in the chemical bath and suffer irreparable damage if they can not be removed at the prescribed time. An example of this is in semiconductor manufacturing, where semiconductor wafers are immersed in etchants, such as hydrofluoric acid, to remove part or all of a film, such as a silicon dioxide, silicon nitride, or other type of film. If left in the acid too long, then over etching of the film may occur. Also, undesired etching into underlying films and/or pitting of the underlying silicon wafer may occur. Such circumstances can result in the need to scrap product wafers. The loss of a single batch of semiconductor wafers can represent a cost of many thousands of dollars, and this number increases as batch sizes and wafer sizes increase.

Generally, any recovery of a wafer lot is done manually, although it is not always possible. An operator or maintenance person uses a specially designed, hand-held hook to lift cassettes of wafers from a chemical tank and move them into a rinse tank. Unfortunately, no tool exists which can be used to manually lift the new "reduced" cassettes currently used in wet tanks to improve flow around wafers. These cassettes are not structurally designed for such lifting and must be lifted by robots which grip both ends of the cassette. Other solutions which have been discussed involve automated or semi-automated backup robots to remove wafer lots if the main robot is disabled. For modern automated processing equipment in the semiconductor industry, manual transfer of stranded wafer lots into a de-ionized water rinse tank, also called a "safe haven," is complicated by modern designs. Modrn wet benches are designed with so-called "mini-environments" or tool enclosures, robots and associated rails, tank lids and other hardware which are impediments to swift manual access to chemical tanks under emergency conditions. Any effort to remove the wafers from the chemical and transport them into a water tank must be done quickly such that chemical does not evaporate on the wafer surfaces prior to immersion in water. The systems are designed for automated processing without manual intervention and the modern design prevents swift manual intervention.

Furthermore, recent increases in batch sizes (up to 100 wafers per batch currently) and wafer size (up to 300 millimeters (mm) currently) render manual transport of wafer batches ergonomically unfeasible, particulary so considering the nature of the cassettes currently used to hold wafers. As indicated the "reduced" cassettes have minimal support and are designed to be transported by large robots, not people. Finally, health and safety issues associated with working near hazardous chemicals remain an additional concern. Accordingly, it is undesirable to have fabricator personnel reaching into tanks of hazardous chemicals to remove parts.

Thus, it can be seen from the above discussion that it would be an improvement in the art to provide a method for reducing the damage to industrial parts, such as semiconductor wafers, when a malfunction of a robot or associated computer hardware or software occurs in an automated chemical processing system.

DISCLOSURE OF INVENTION

According to the present invention, a method for stopping chemical processing of a semiconductor wafer is provided comprising the steps of: 1) placing a chemical having a water concentration of 92% or less in a tank; 2) processing a semiconductor wafer with the chemical in the tank; 3) quick draining the chemical from the tank; and 4) rinsing the wafer in the tank with a rinsing material to stop chemical action. For example, the rinsing material may be de-ionized water and the rinsing step may include either at least partially filling the tank with water, applying the water with a spray bar, or both. Additionally, depending on the extent of the initial processing, the wafer may be reprocessed after again placing the chemical in the tank.

Another method of chemical processing is provided comprising the steps of: 1) placing a chemical in a process tank; 2) processing a semiconductor wafer with the chemical in the process tank; 3) quick draining the chemical from the process tank into a storage tank; 4) rinsing the wafer in the process tank with a rinsing material to stop chemical action; and 5) recycling the drained chemical from the storage tank to the process tank for use in a subsequent process step.

A method of chemical processing in an emergency is also provided comprising the steps of: 1) placing a chemical in a process tank; 2) processing a semiconductor wafer with the chemical in the process tank; 3) detecting a malfunction in the processing; 4) quick draining the chemical from the process tank; and 5) rinsing the wafer in the process tank with a rinsing material to stop chemical action.

Also, a chemical processing system is provided comprising: 1) a process tank adapted to processing semiconductor wafers in a chemical having a water concentration of 92% or less; 2) a control system adapted to detecting a malfunction in processing; 3) a drain valve adapted to quick draining the chemical in the process tank; 4) a spray bar adapted to applying a rinsing material to the wafers in the process tank; and 5) a recirculation system to recirculate chemical from the process tank through a treatment process.

Another chemical processing system is provided comprising: 1) a process tank adapted to processing semiconductor wafers in a chemical having a water concentration of 92% or less; 2) a control system adapted to detecting a malfunction in processing; 3) a drain valve adapted to quick draining the chemical in the process tank; 4) a storage tank adapted to storing the quick drained chemical; 5) a spray bar adapted to applying a rinsing material to the wafers in the process tank; and 6) a recycling mechanism adapted to returning the quick drained chemical to the process tank.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements, and.

BEST MODE FOR CARRYING OUT THE INVENTION

As discussed above, a need existed to provide a method for reducing the damage to industrial parts, such as semiconductor wafers, when a malfunction of a robot or associated computer hardware or software occurs in an automated chemical processing system. The conventional approach is to remove the wafers from the automated system and place them in a rinse tank. For several reasons, as indicated earlier, the conventional approach has become more difficult while the potential loss due to a malfunction has become more costly. Thus, the present invention provides several methods and apparatus for quick draining chemical process tanks in a chemical processing system. When quick draining of a process tank is provided, the chemical action in the process tank may be quickly stopped to prevent damage from over processing. The methods and apparatus according to the present invention provide a solution to the problem of an automation malfunction and also provide for quick draining when otherwise needed in a chemical process. For various reasons discussed below, this new approach in a chemical processing system was previously not known, particularly with regard to semiconductor wafer processing.

According to a preferred embodiment of the present invention, a method for stopping chemical processing of a semiconductor wafer includes the steps of: 1) placing a chemical in a tank; 2) processing a semiconductor wafer with the chemical; 3) quick draining the chemical; and 4) rinsing the wafer to stop chemical action. Depending on the extent of the initial processing, the rinsed wafer may be reprocessed after again placing the chemical in the tank. In an alternative preferred embodiment of the method the chemical is quick drained from the process tank into a storage tank and later recycled back to the process tank for use in a subsequent process step. In another alternative preferred embodiment of the method, the step of detecting a malfunction in the processing triggers the quick draining.

Also, a preferred embodiment of the present invention includes a chemical processing system having a process tank, a quick drain valve, and a rinsing mechanism. Alternative preferred embodiments are provided that include one or more of the following elements: a control system to detect a malfunction in processing, a spray bar to apply rinsing material, a recirculation system to recirculate chemical from the process tank through a treatment process, and a storage tank coupled with a recycling mechanism to returning quick drained chemical.

Figure 1:
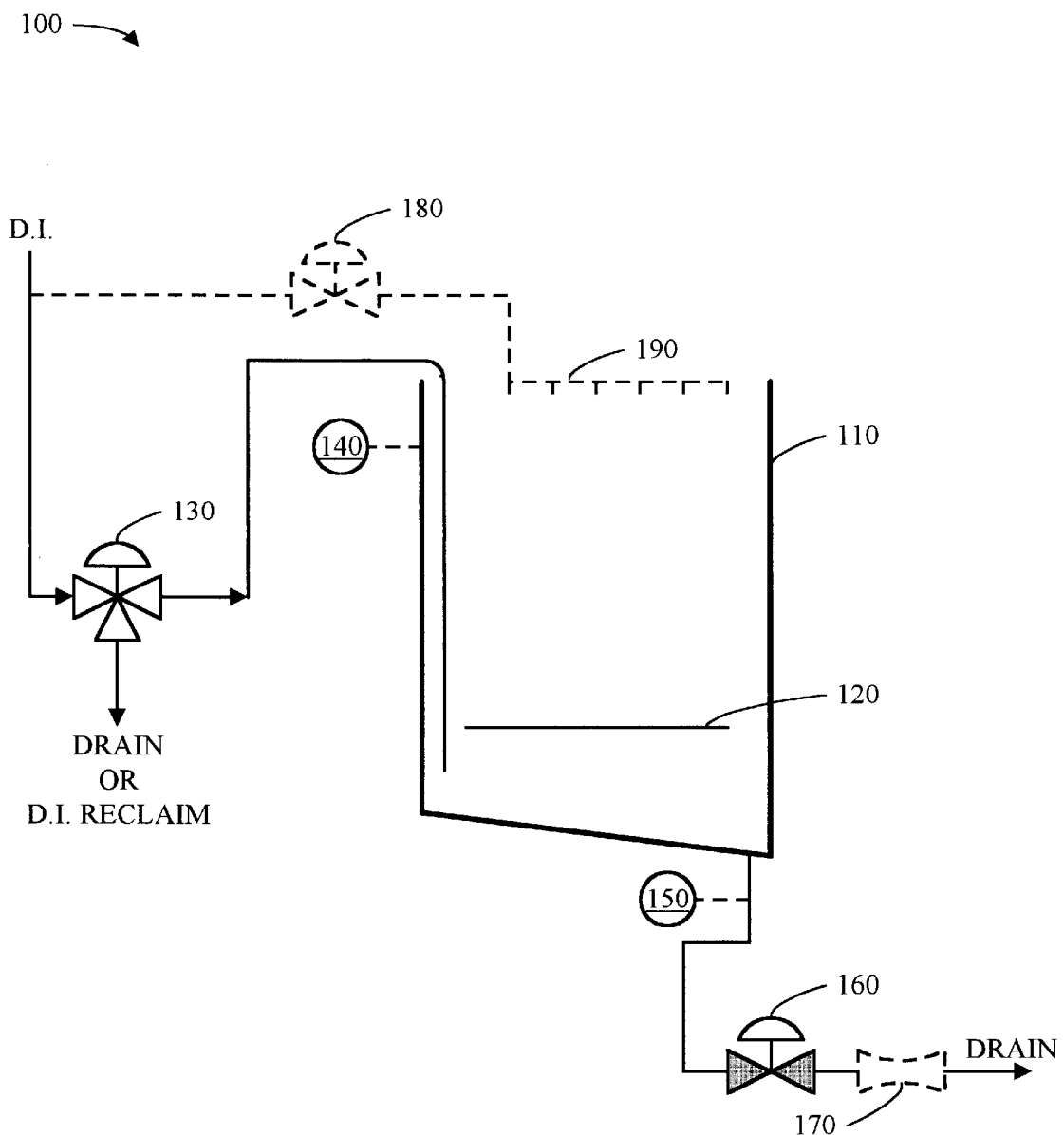
FIGS. 1–3 are piping and instrumentation diagrams, each showing one variation of a chemical processing system according to a preferred embodiment of the present invention.

Referring now to FIG. 1, a chemical processing system 100 according to a preferred embodiment of the present invention is shown. Chemical processing system 100 includes a process tank 110, a cassette support rack 120 within process tank 110, a water supply valve 130, and a drain valve 160. Process tank 110 may be quick drained of a chemical contained therein according a preferred embodiment of the present invention by opening drain valve 160 meeting the requirements described below. When process tank 110 is empty, a tank empty sensor 150 will indicate the tank status, allowing drain valve 160 to be closed so that tank 110 may be filled again with water, the chemical, or other liquids as required. Process tank 110 may be filled with water by opening water supply valve 130 allowing preferably de-ionized water to enter tank 110. A tank full sensor 140 is provided to avoid overfilling tank 110. In addition, system 100 optionally includes a water spray system including a water spray valve 180 and one or more spray bars 190. By opening water spray valve 180 preferably de-ionized water may be sprayed into process tank 110 and onto a wafer lot resting on cassette support rack 120 to slow or stop chemical action on wafers while process tank 110 is being drained of chemical or filled with water. Spray bars 190 help to slow or stop chemical action more quickly and, thus, are optional since chemical action may be stopped sufficiently quick in some processes simply by draining tank 110 and filling it with water. A wide variety of distribution mechanisms for applying rinsing material to wafers are conceivable that are sufficient for the present invention. Essentially, any mechanism that applies the rinsing material to needed areas in the tank will suffice. Also, although not preferred, other liquids known to those skilled in the art that may stop chemical action, including mixtures of a plurality of liquids, may be substituted or mixed with the preferably de-ionized water.

FIG. 1 also shows an optional aspirator 170 used to cool or dilute liquids drained from process tank 110 when necessary. Aspirator 170 is optional since not all liquids drained from process tank 110 require cooling and/or dilution. Essentially, aspirator 170 may be a venturi device connected to a water source, such that water, or another diluent and/or coolant, may be injected at the venturi into the liquid draining from process tank 110. Thus, draining process tank 110 through aspirator 170 may take longer than draining without aspirator 170, since a venturi can act as a flow restriction. Also, a given aspirator 170 has a limit as to the amount of diluent/coolant that may be injected into the draining liquid. Accordingly, using a drain valve 160 that drains quickly by comparison to conventional drain valves may require an aspirator with a higher cooling/dilution limit than is conventionally used to maintain a given temperature and/or chemical concentration.

Notably, drain valve 160 in FIG. 1 is represented using the symbol for a diaphragm valve, but it may also be a solenoid valve, a motor valve, an air-operated valve, or another valve. However, it is particularly important that drain valve 160 be a large orifice drain valve or some other draining mechanism which allows quick draining of process tank 110. Such quick draining valves and mechanisms are not normally used on chemical process tanks, particularly in semiconductor manufacturing. One example of a suitable drain valve 160 is a chemical resistant type of drain valve with a sufficiently large orifice and an interior coating of a fluoroplastic material. Exemplary fluoroplastics include perfluoroalkoxy polymer (PFA) available from E.I. du Pont de Nemours in Wilmington, Del. as one of the substances under the trademark TEFLON and polyvinylidene fluoride (PVDF) available from Elf Atochem North America in Philadelphia, Pa. under the trademark KYNAR. Other examples of suitable valves not normally used on a chemical process tank include PVDF diaphragm valves of about 10 centimeters (cm) (4 inches (in.)) in diameter, PVDF ball valves of about 15 cm (6 in.), and PVDF butterfly valves of about 23 cm (9 in.).

It is preferred to mount drain valve 160 as close to the bottom of process tank 110 as possible to minimize any stagnant areas in process tank 110 where particles may accumulate. Also, it is preferred that no flow restrictions in the piping above and below drain valve 160 exist that will reduce the flow of liquid from process tank 110 below the desired quick draining rate. Basically, it is preferred that process tank 110 drain as quickly as necessary to remove chemical from process tank 110 and replace it with water to stop chemical action on wafers before they are irreparably damaged. Of course, selecting the actual quick draining rate will depend upon several factors. In some processes, an extra 30 seconds of chemical action may be sufficient to cause irreparable damage while, in other processes, an extra 30 minutes of processing will not appreciably damage the wafers. That is, shorter process windows require quicker draining than do longer process windows. Accordingly, the needed quick draining rate should be determined and used along with the tank volume and dimensions, as well as any other significant factors, to ensure that the type, size and number of drain valves 160 are adequate to provide the needed quick draining rate.

Figure 4:
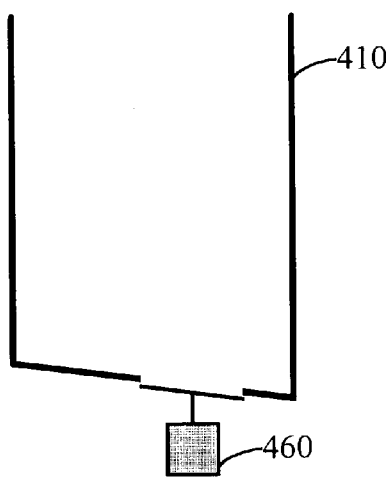
FIGS. 4–6 are piping and instrumentation diagrams, each showing one variation of a tank drain for use in the systems of FIGS. 1–3.
Figure 5:
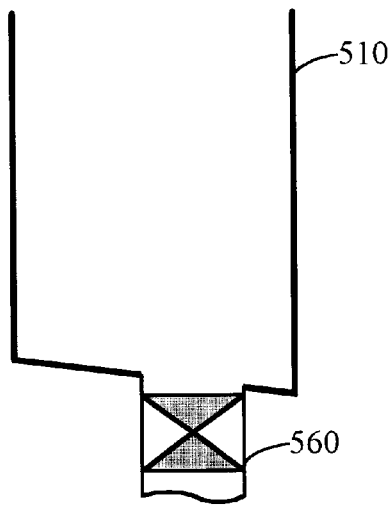
Figure 6:
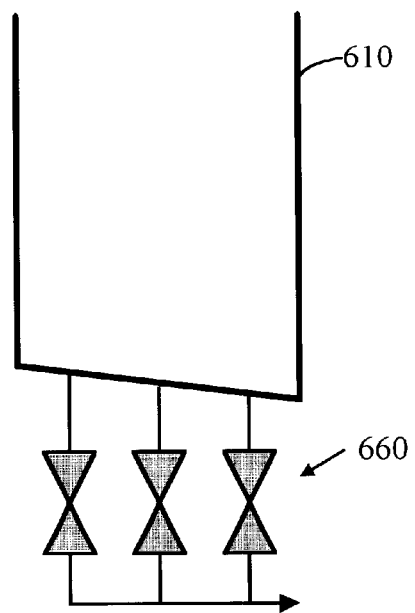

FIGS. 4 through 6 show a few exemplary valve arrangements that may be used in place of drain valves 160 or 330. FIG. 4 shows a "quick dump" style gate 460 as a drain valve for process tank 410. "Quick dump" valve 460 is essentially a gate covering a large orifice opening about the bottom of process tank 410. When the gate is opened, a large amount of liquid may quickly drain from process tank 410. This type of mechanism is conventionally used with a "quick dump" tank for rough rinsing wafers after they are removed from process tank 110. While the chemical in process tank 110 preferably has a water concentration of 92% or less, a rough rinse or "quick dump" tank generally contains approximately 100% water except for the chemical residues that collect therein. In a conventional "quick dump tank" the tank is filled with water to rinse the wafers and, periodically, quickly dumped into a facility drain system (not shown). Periodic quick dumping of a rough rinse tank is cost effective because the water is relatively inexpensive compared to the loss of defective wafers from inadequate rinsing. However, it is not known to provide a "quick dump" valve 460 on a tank containing chemicals for processing such as process tank 410 or 110 with a water concentration of 92% or less. Since the chemical concentration in such a tank is 8% or more, it would be quite unusual to quick dump the tank contents.

There are a wide variety of chemicals and chemical concentrations that may be used in the present invention. For example, concentrated hydrofluoric acid (HF) having a chemical concentration of 49 weight percent ( hereinafter "wt %") is commonly used in the semiconductor industry, but five:one (5:1) and one:one (1:1) dilutions of 49 wt % HF with water are also commonly used. A 5:1 dilution has a water concentration of about 92 wt % and a 1:1 dilution has a water concentration of about 75 wt %. Of course, other dilution levels are conceivable and within the scope of the present invention. Concentrated sulfuric acid having a chemical concentration of about 96 wt % and a water concentration of about 4% and n-methyl-2-pyrrolidone (NMP) having a chemical concentration of 100% and a water concentration of about 0%, as well as dilutions of these chemicals, may also be used in the present invention.

In FIG. 5 a process tank 510 is shown with a large orifice drain valve 560. As indicated earlier, drain valve 560 could be multiple kinds of valves including diaphragm valves, ball valves, butterfly valves, and other valves. For similar reasons to those mentioned for "quick dump" valves 460, it is not known to provide a large orifice drain valve 560 on a tank containing chemicals for processing such as tank 510 or 110. Previously, no need existed to provide such a valve. Next, FIG. 6 shows a process tank 610 with a plurality of drain valves 660. The plurality of drain valves 660 may include drain valves typically used on chemical process tanks, but more than one valve is provided to encourage quicker draining of chemicals from process tank 610 in accordance with the present invention.

In conventional chemical processing systems it is not known to provide a quick draining mechanism, such as drain valve 160, "quick dump" valve 460, large orifice drain valve 560, or plurality of drain valves 660. Rather, such quick draining mechanisms are normally not associated with process tanks in semiconductor processing, except for "quick dump" tanks (not shown) used to rinse wafers after processing in a chemical processing system. Recent developments in valve technology have improved "quick dump" valves and large orifice valves such that they are now more compatible with the chemicals used in chemical processing systems. Previously, most of the types of valves needed for a "quick dump" mechanism were less reliable and more subject to damage or leaking when exposed to chemicals in typical chemical processing systems. In addition, the cost of chemicals used in chemical processing systems was previously significant relative to the cost of wafers processed in such a system. Circumstances have changed now due to increased wafer size and increased numbers of wafers in a given lot. Thus, the present invention recognizes that the cost of a single batch of wafers lost in a malfunction is relatively high, decreasing the significance of the loss of chemical drained from a process tank. Accordingly, even though the chemical in process tank 110 as shown in FIG. 1 is discarded, the discarding may be justified under the new circumstances in order to save the more costly wafers processed therein.

Figure 2:
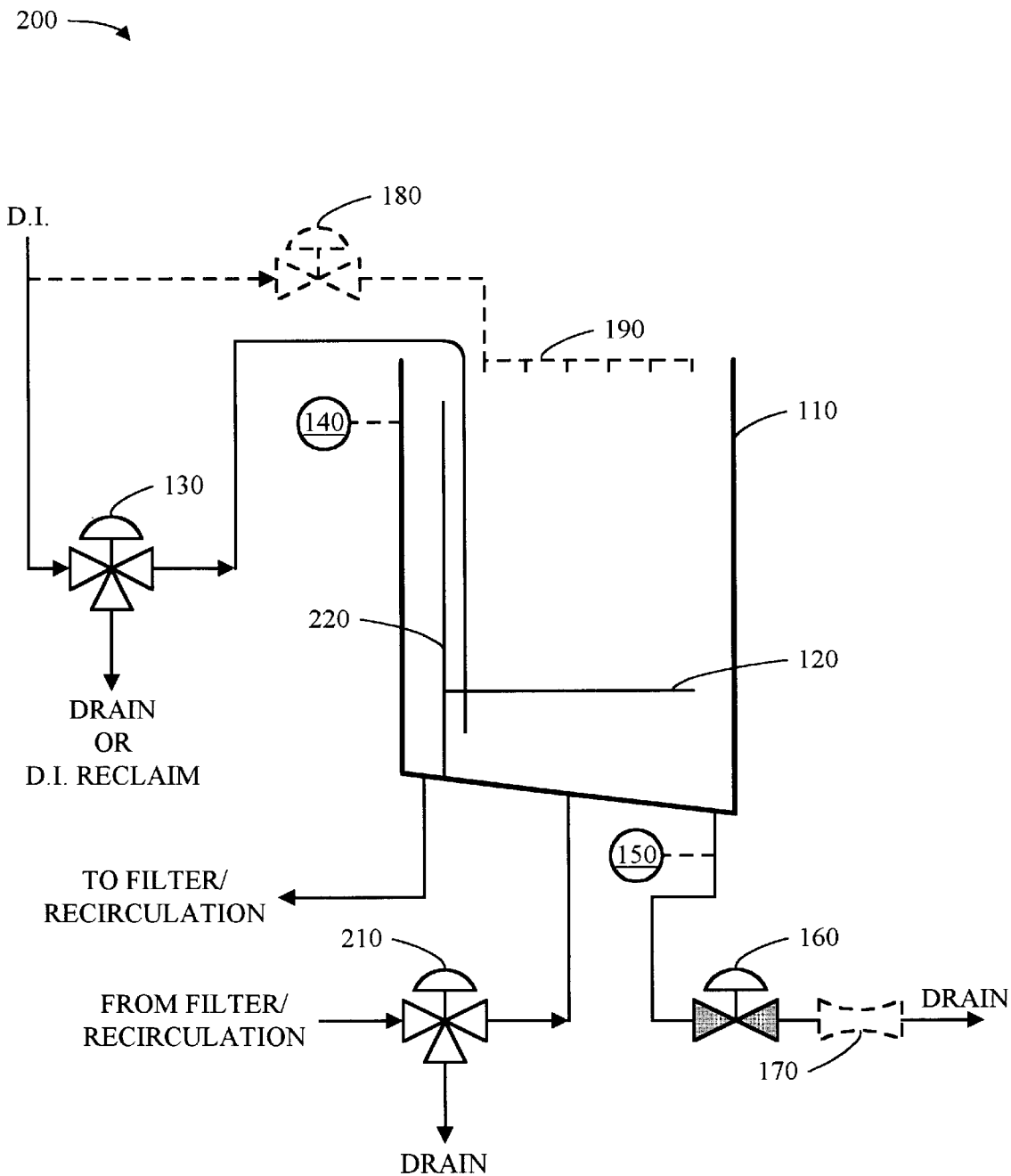

Referring now to FIG. 2, a recirculating chemical processing system 200 is shown that is similar in most respects to chemical processing system 100 except that the chemical in process tank 110 re-circulates, possibly through a treatment or filter system. The recirculating feature may be desirable in some process tanks where continual mixing, treatment, or filtering of the chemical in process tank 110 is beneficial to efficient chemical processing. For example, an existing chemical bath in a given tank is often "spiked" with additional chemical to extend the life of the chemical bath. The recirculating feature mixes the "spiked" chemical into the bath and also filters out particles that may accumulate and otherwise limit the effective life of the bath. Notably, recirculating chemical processing system 200 includes all the elements of chemical processing system 100, but an overflow weir 220 is provided such that chemicals in process tank 110 flow over the top of overflow weir 220 and into a drain leading to recirculation system(s) for treatment, filtering, etc. Once the chemical is treated it returns to process tank 110 through a chemical recirculation valve 210, which selectively directs the chemical to process tank 110 or to a facility drain.

Figure 3:
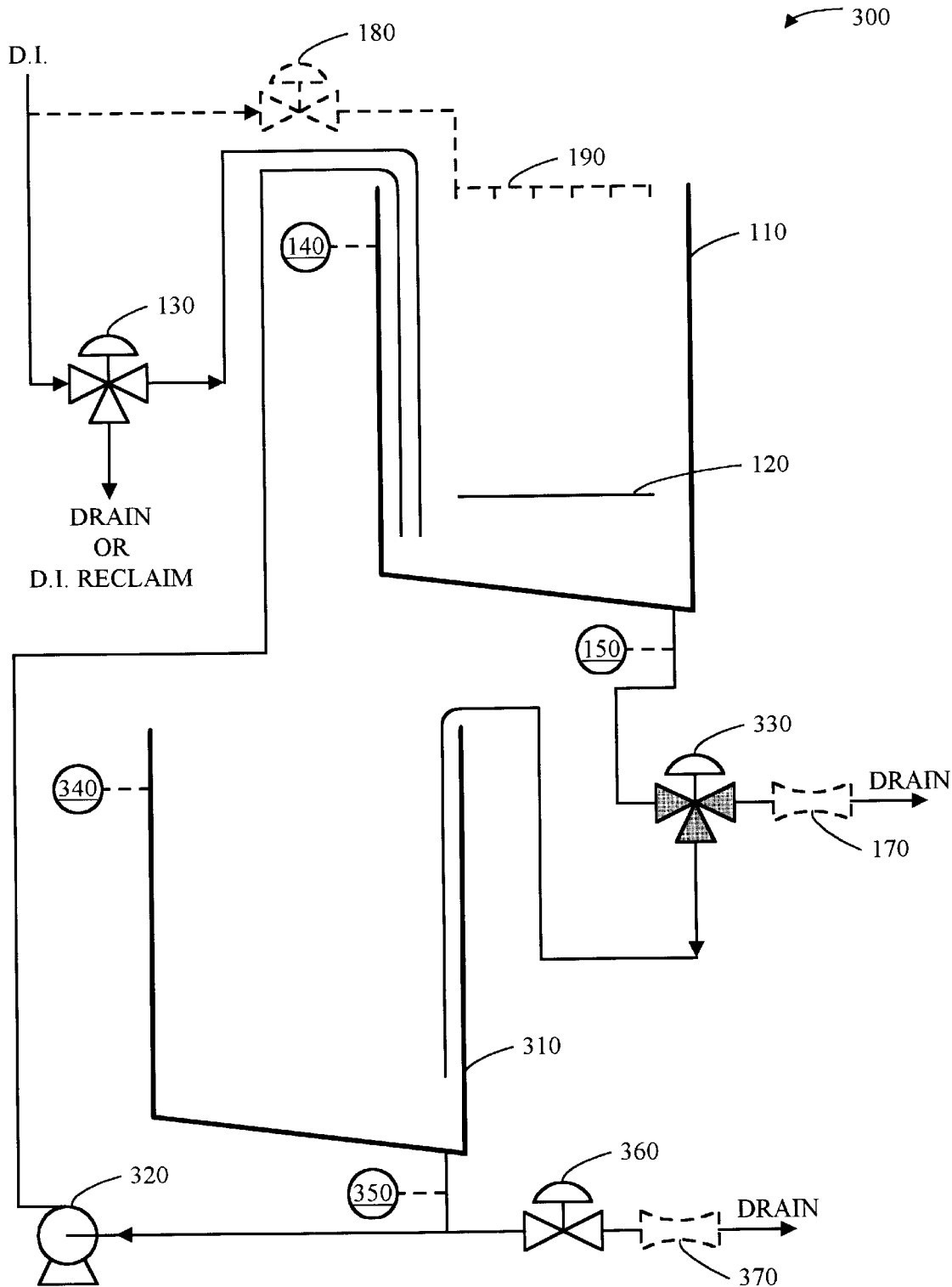

Turning to FIG. 3, a recycling chemical processing system 300 is shown, which includes all of the features of chemical processing system 100 shown in FIG. 1, but additionally provides the option to store and recycle chemicals drained from process tank 110. Since the chemicals are not necessarily discarded, a preferred embodiment of the present invention as shown in FIG. 3 provides the advantage of quick draining without the cost of replacing quick drained chemicals sent to the facility drain. Accordingly, three-way drain valve 330 is provided in place of drain valve 160 such that chemicals drained from process tank 110 may optionally route to the facility drain or to a storage tank 310. Notably, three-way drain valve 330 preferably also provides quick draining of chemicals from process tank 110 whether sent to the facility drain or to storage tank 310. Storage tank 310 is provided with a tank full sensor 340 and a tank empty sensor 350. Thus, after process tank 110 is completely drained and made ready for further processing, chemicals stored in tank 310 may be returned to process tank 110 to continue the chemical process. The recycling is a accomplished by activating recycling pump 320 which drains storage tank 310 and pumps chemicals back into process tank 110. Some other recycling mechanism for delivering chemical stored in tank 310 to process tank 110 may be provided instead of recycling pump 320. If, because of contamination or another reason, the chemicals placed in storage tank 310 are not to be recycled then drain valve 360 is provided to send the chemicals to the facility drain. Also, an optional aspirator 370 similar to aspirator 170 shown in FIG. 1 is provided to cool or dilute chemicals drained from storage tank 310. As similarly indicated for aspirator 170, aspirator 370 is not necessarily required for all storage tanks 310.

Figure 7:
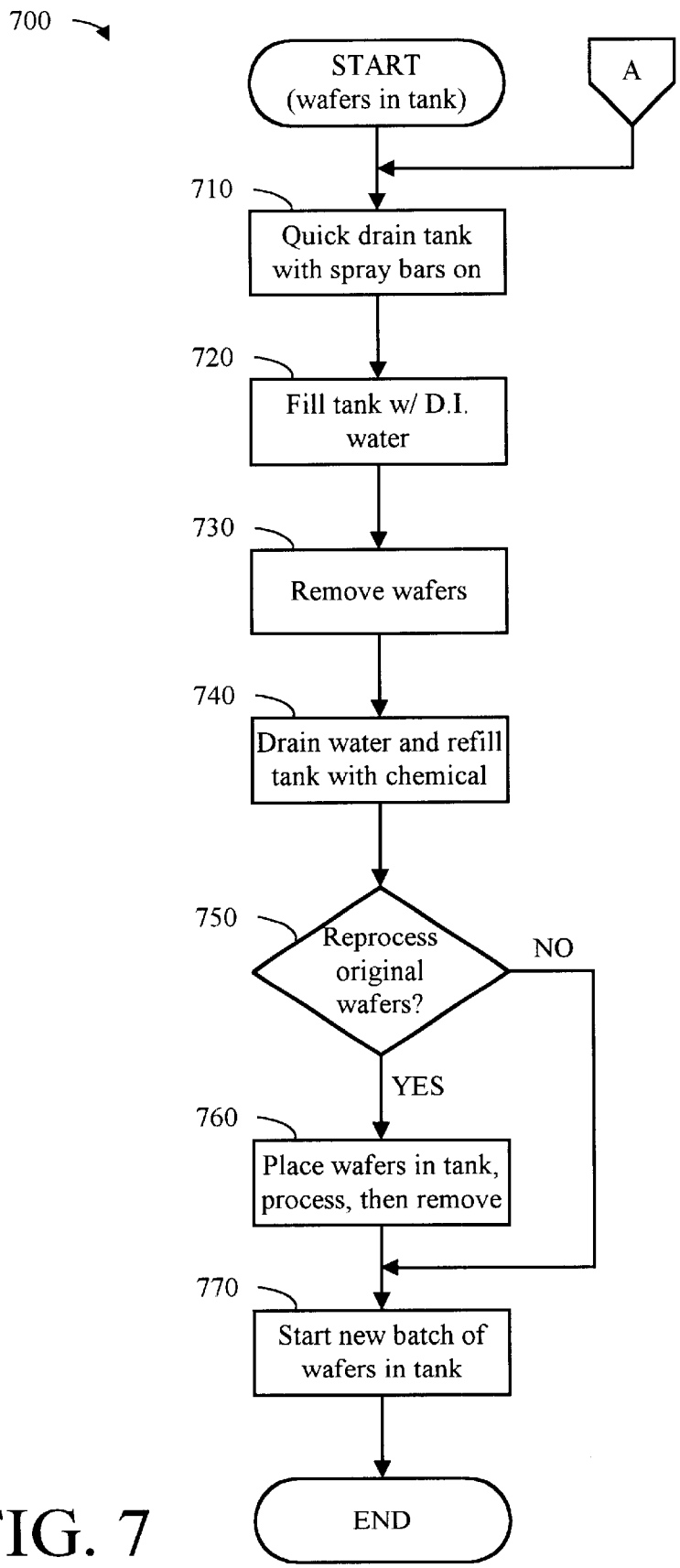
FIG. 7 is a flow diagram showing a non-emergency method for recovery of semiconductors from a chemical processing tank.

Turning to FIG. 7, a method for recovering semi-conductor wafers from a chemical process tank is described. Method 700 shown in FIG. 7 begins with wafers already in a tank, such as process tank 110, 410, 510, or 610, and being processed. For convenience only, tank 110 will be referred to hereinafter. Specifically, method 700 is a non-emergency method, wherein the chemical process possesses a relatively large process window. Accordingly, it is not critical to remove wafers from process tank 110 in a short time after malfunction of the automated removal equipment. Step 710 provides that the drain valve such as drain valve 160, 460, 560, or 660 is opened to quickly remove the chemical from contact with the wafers. For convenience only, drain valve 160 will be referred to hereinafter. While draining process tank 110, spray bars 190 may be turned on by opening water spray valve 180 to at least partially rinse the chemicals from wafers in process tank 110. With spray bars 190 turned on, chemical action on the wafers will slow or stop even before process tank 110 is completely empty. However, the sprayed water will combine with chemical still in process tank 110, diluting it. Thus, if the chemical is drained to storage tank 310 rather than the facility drain, then it may be desirable not to turn on spray bars 190 until after draining is complete. Otherwise, the chemical in storage tank 310 will be diluted and may not be suitable for reuse in process tank 110.

Once process tank 110 is empty, as indicated by tank empty sensor 150, drain valve 160 is closed and step 720 is executed. In step 720 water supply valve 130 is opened to fill process tank 110 with de-ionized water and to stop chemical processing of the wafers in process tank 110. If spray bars 190 were not turned on during step 710, then they could be turned on during step 720. Once chemical processing has stopped, the wafers may be removed as described by step 730, then the water may be drained and the tank refilled with chemicals as provided by step 740. If a recycling chemical process system is used, such as system 300 shown in FIG. 3, then the chemicals in storage tank 310 may be returned to process tank 110 at this point. In step 750 a choice is made whether to reprocess the original wafers. If the original wafers were processed to the point that they were sufficiently completed, then no reprocessing is needed and step 770 may be executed by starting a new batch of wafers in process tank 110. However, if the processing of the original wafers was not completed far enough after the malfunction of the tool automation, then additional processing may be desirable. Thus, step 760 may be executed by placing the original wafers back in process tank 110, completing the processing, and removing the reprocessed wafers, followed by step 770 as described.

Although method 700 includes both rinsing with spray bars 190 and filling process tank 110 with water, both of these steps may not always be needed. Accordingly, the scope of the present invention includes rinsing with spray bars 190, but not filling process tank 110 with water, prior to removing wafers in step 730. Further, the present invention also includes filling the tank with water prior to step 730, but not rinsing with spray bars 190. It should also be noted that method 700 may be used in any of the chemical processing systems described above or in other systems within the scope of the present invention, that is the quick draining of process tank 110 may be to a facility drain or it may be to a storage tank 310 as shown in FIG. 3. Further, the mechanism for quick draining may comprise any of the quick draining mechanisms described above or other such mechanisms within the scope of the present invention. Accordingly, if storage tank 310 were available for use by method 700 then step 740 of refilling the tank with chemicals would include activating recycling pump 320 to refill process tank 110.

Figure 8:
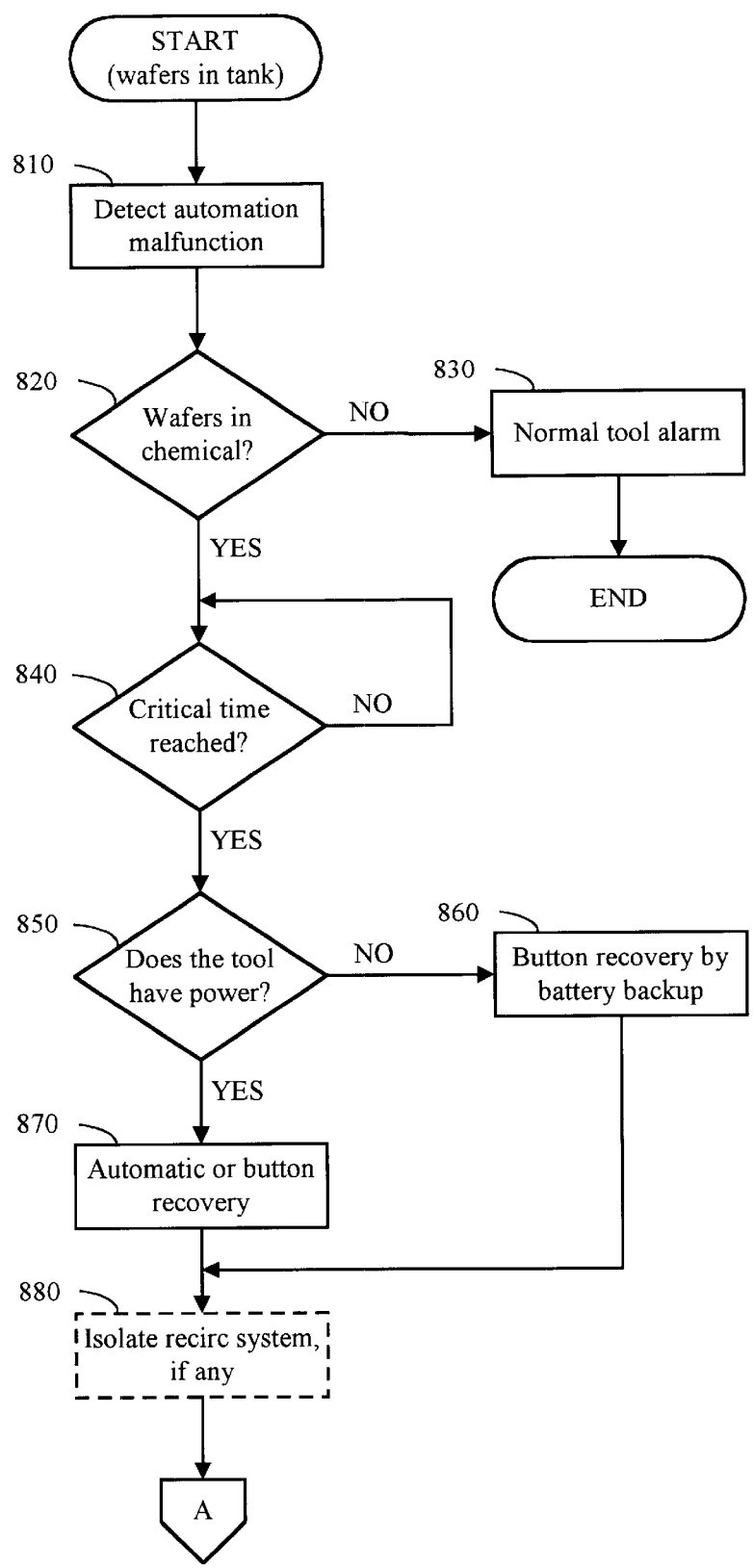
FIG. 8 is a flow diagram showing an emergency method for recovery of semiconductors from a chemical processing tank.

Referring now to FIG. 8, an emergency method for removing semi-conductor wafers from a chemical process tank 800 is shown. Method 800 begins with wafers being processed in process tank 110 or another process tank described herein. In step 810 detection of a malfunction in the tool automation occurs. Notably, in method 700 it is not necessary to detect an automation malfunction. However, a malfunction is one reason for executing method 700. It may also be desirable to execute method 700 solely as a part of routine processing in a situation where it is desirable to quickly drain the chemical from process tank 100 and stop chemical action by quickly rinsing the wafers. Once an automation malfunction is detected in step 810, a check is made in step 120 as to whether the wafers are in the chemical. If the wafers are not in a chemical, then step 830 occurs wherein a normal tool alarm is provided by the process control system. The tool alarm alerts an operator of the malfunction and the need for further action, which may or may not include removal of wafers. However, if the wafers are in chemical, then a second decision is evaluated in step 840 to determine whether a critical time has been reached for the wafers. The critical time will vary widely according the type of processing being done. Basically, the critical time is a length of processing after which wafers may be damaged if left in process tank 100. Of course, in determining critical time, some consideration should be given for the delay in stopping chemical action once quick draining begins.

After a critical time is reached in step 840, another decision is evaluated in step 850 to determine whether the tool has power. If the tool does not have power, then step 860 is required, meaning an individual operator must press a button to electrically activate the recovery by using a battery back-up system. Since the tool does not have power, the normal process control system is typically inoperative and would not be available for actuating a recovery. However, if the tool has power then step 860 is not required, but is optional as shown in step 870 wherein in automatic recovery actuated by the process control system is also possible. Once recovery is actuated, either manually or automatically, optional step 880 is executed by isolating any recirculating system that might be present. Isolation simply refers to closing chemical recirculation valve 210 shown in FIG. 2 such that chemical is no longer being reintroduced into process tank 110. If recirculation valve 210 were left open, then the chemical already in the recirculation system would continue to enter process tank 110 and impede draining. No additional chemical, however, will be routed to recirculation since it will not exceed overflow weir 220 once the level in process 110 is sufficiently low. Thus, closing chemical recirculation valve 210 is optional since it simply helps to drain process tank 110 more quickly and the required draining rate depends upon the particular type of processing being conducted in process tank 110. After optional step 880, method 800 is joined with method 700 by the continuation symbol "A" shown at the top of FIG. 7. Thus, once special determinations are made regarding the criticality of processing in method 800, method 800 continues with steps 710 through 770 of method 700 as discussed previously.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation.

What is claimed is:

1. A method of chemical processing to prevent damage to a semiconductor wafer due to over-processing comprising the steps of:
   placing a chemical having a water concentration of about 92% or less in a tank;
   processing a semiconductor wafer with the chemical in the tank;
   detecting a malfunction in an automated chemical processing system;
   draining the chemical from the tank in response to detecting the malfunction to prevent damage to a semiconductor wafer due to over-processing with the chemical in the tank; and
   rinsing the wafer in the tank with a rinsing material to stop chemical action.

2. The method of claim 1, wherein the water concentration comprises 51% or less.

3. The method of claim 1, wherein the water concentration comprises 4% or less.

4. The method of claim 1, wherein the water concentration comprises 0%.

5. The method of claim 1, wherein the rinsing material comprises water.

6. The method of claim 1, additionally comprising the steps of:
   draining the rinsing material from the tank;
   again placing the chemical in the tank; and
   reprocessing the wafer for which chemical action was previously stopped.

7. The method of claim 1, wherein the step of rinsing does not begin until the step of draining is completed.

8. The method of claim 1, wherein rinsing comprises at least partially filling the tank with the rinsing material.

9. The method of claim 1, wherein:
   the tank comprises a process tank;
   the step of processing a semiconductor wafer comprises placing the semiconductor wafer to be processed in the process tank with the chemical;
   the step of draining comprises quick draining the chemical from the process tank into a storage tank; and
   the method further comprises the step of recycling the drained chemical from the storage tank wherein the storage tank is adapted to store the drained chemical, to the process tank for use in a subsequent process step.

10. The method of claim 8, wherein rinsing additionally comprises applying the rinsing material to the wafer with a distribution mechanism.

11. The method of claim 10, wherein the distribution mechanism comprises a spray bar.

12. The method of claim 1 wherein the malfunction is a malfunction of an automated processing robot.

13. The method of claim 1 wherein the malfunction is a malfunction of automated processing software.

14. The method of claim 1 wherein the malfunction is a malfunction of automated processing hardware.

15. The method of claim 1 wherein the malfunction is a malfunction of a power supply.

16. A method of chemical processing to prevent damage to a semiconductor wafer due to over-processing comprising the steps of:
   placing a chemical in a process tank;
   processing a semiconductor wafer with the chemical in the process tank;
   detecting a malfunction in an automated chemical processing system;
   draining the chemical from the process tank in response to detecting the malfunction; and
   rinsing the wafer in the process tank with a rinsing material to stop chemical action.

17. The method of claim 16, wherein draining the chemical from the tank comprises draining the chemicals to a storage tank, the method further comprising recycling the drained chemical from the storage tank to the process tank for use in a subsequent process step.

18. The method of claim 16, wherein the rinsing material comprises water.

19. The method of claim 16, additionally comprising the step of reprocessing the wafer for which chemical action was previously stopped.

20. The method of claim 16, wherein the step of rinsing does not begin until the step of quick draining is completed.

21. The method of claim 16, wherein rinsing comprises at least partially filling the tank with the rinsing material.

22. The method of claim 21, wherein rinsing further comprises applying the rinsing material to the wafer with a distribution mechanism.

23. The method of claim 22, wherein the distribution mechanism comprises a spray bar.

24. The method of claim 16 wherein the malfunction is a malfunction of an automated processing robot.

25. The method of claim 16 wherein the malfunction is a malfunction of automated processing software.

26. The method of claim 16 wherein the malfunction is a malfunction of automated processing hardware.

27. The method of claim 16 wherein the malfunction is a malfunction of a power supply.

28. The method of claim 23 wherein the malfunction is a malfunction of an automated processing robot.

29. The method of claim 23 wherein the malfunction is a malfunction of automated processing software.

30. The method of claim 23 wherein the malfunction is a malfunction of automated processing hardware.

31. The method of claim 23 wherein the malfunction is a malfunction of a power supply.

32. A chemical processing system comprising:

a process tank adapted to process semiconductor wafers in a chemical having a water concentration of about 92% or less;

a detector associated with the chemical processing system;

a drain valve adapted to drain the chemical in the process tank in response to a malfunction detected in the chemical processing system by the detector; and a distribution mechanism adapted to apply a rinsing material to the wafers in the process tank.

33. The system of claim 32, wherein the rinsing material comprises water.

34. The system of claim 32, further comprising:

a storage tank adapted to store the quick drained chemical; and a recycling mechanism adapted to returning the quick drained chemical to the process tank.

* * * * *